United States Patent
Deb et al.

(10) Patent No.: US 11,515,846 B2
(45) Date of Patent: Nov. 29, 2022

(54) AMPLIFIER, CONFIGURATION METHOD OF AMPLIFIER, AND COMMUNICATION APPARATUS

(71) Applicant: NEC Corporation, Tokyo (JP)

(72) Inventors: Soubhik Deb, Tokyo (JP); Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 250 days.

(21) Appl. No.: 16/769,309

(22) PCT Filed: Dec. 4, 2017

(86) PCT No.: PCT/JP2017/043479
§ 371 (c)(1),
(2) Date: Jun. 3, 2020

(87) PCT Pub. No.: WO2019/111296
PCT Pub. Date: Jun. 13, 2019

(65) Prior Publication Data
US 2021/0184635 A1    Jun. 17, 2021

(51) Int. Cl.
*H03F 1/32* (2006.01)
*H03F 3/24* (2006.01)
*H03M 1/12* (2006.01)
*H04B 1/38* (2015.01)

(52) U.S. Cl.
CPC ........... *H03F 1/3241* (2013.01); *H03F 3/245* (2013.01); *H03M 1/12* (2013.01); *H03F 2201/3215* (2013.01); *H04B 1/38* (2013.01)

(58) Field of Classification Search
CPC .................................................. H03F 1/3241
See application file for complete search history.

(56) References Cited

U.S. PATENT DOCUMENTS

| | | | |
|---|---|---|---|
| 6,298,097 B1 * | 10/2001 | Shalom | H03F 1/3294 375/296 |
| 6,493,543 B1 | 12/2002 | Shin et al. | |
| 9,748,983 B2 * | 8/2017 | Tanio | H03F 3/3022 |
| 2007/0281635 A1 * | 12/2007 | McCallister | H03F 1/02 455/126 |

(Continued)

FOREIGN PATENT DOCUMENTS

JP    2008-258704 A    10/2008

OTHER PUBLICATIONS

International Search Report corresponding to PCT/JP2017/043479, dated Feb. 20, 2018 (2 pages).

(Continued)

*Primary Examiner* — Patricia T Nguyen

(57) ABSTRACT

An in-band extraction unit is configured to extract an in-band from an output signal. An out-band extraction unit is configured to extract at least one pair of out-bands including a low frequency side out-band and a high frequency side out-band from the output signal. An ADC is configured to convert the extracted in-band and out-bands to digital signals. A signal processing unit is configured to process information included in the digital signals converted by the analog to digital converter and adjust an operation of predistorting an input baseband digital signal to generate the output signal.

6 Claims, 11 Drawing Sheets

(56) References Cited

U.S. PATENT DOCUMENTS

| | | | | |
|---|---|---|---|---|
| 2009/0124218 A1* | 5/2009 | McCallister | .......... | H03F 1/3247 |
| | | | | 455/114.2 |
| 2012/0250790 A1* | 10/2012 | Yang | .................... | H04L 27/368 |
| | | | | 375/296 |
| 2014/0347126 A1 | 11/2014 | Laporte et al. | | |
| 2016/0065147 A1 | 3/2016 | Pratt et al. | | |
| 2018/0262168 A1* | 9/2018 | Dzhigan | ............... | H03F 1/3258 |

OTHER PUBLICATIONS

Written Opinion corresponding to PCT/JP2017/043479, dated Feb. 20, 2018 (4 pages).

R.N. Braithwaite, "Closed-loop digital predistortion (DPD) using an observation path with limited bandwidth", IEEE Transactions on Microwave Theory and Techniques, vol. 63, No. 2, Feb. 2015. pp. 1-11.

* cited by examiner

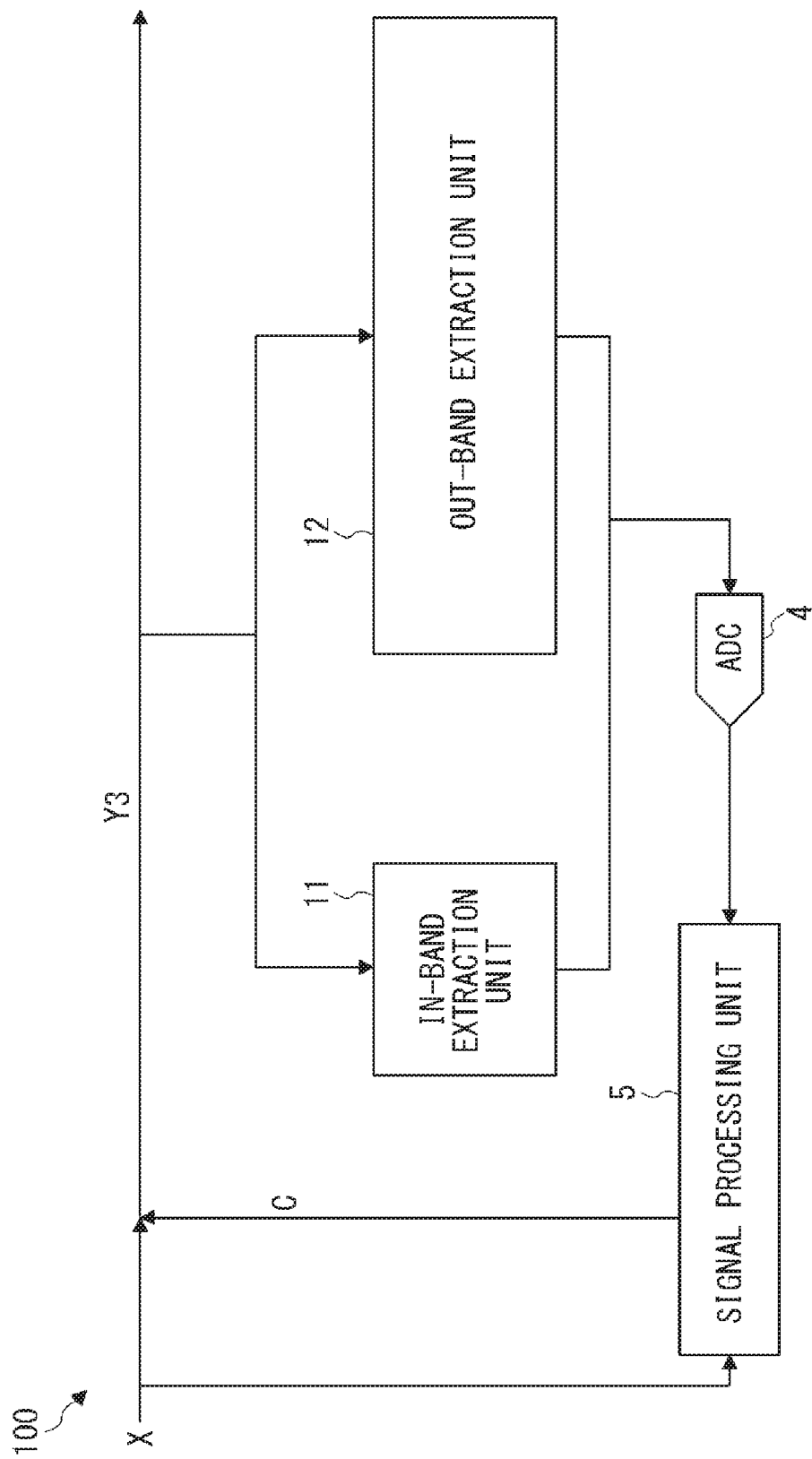
[FIG. 1]

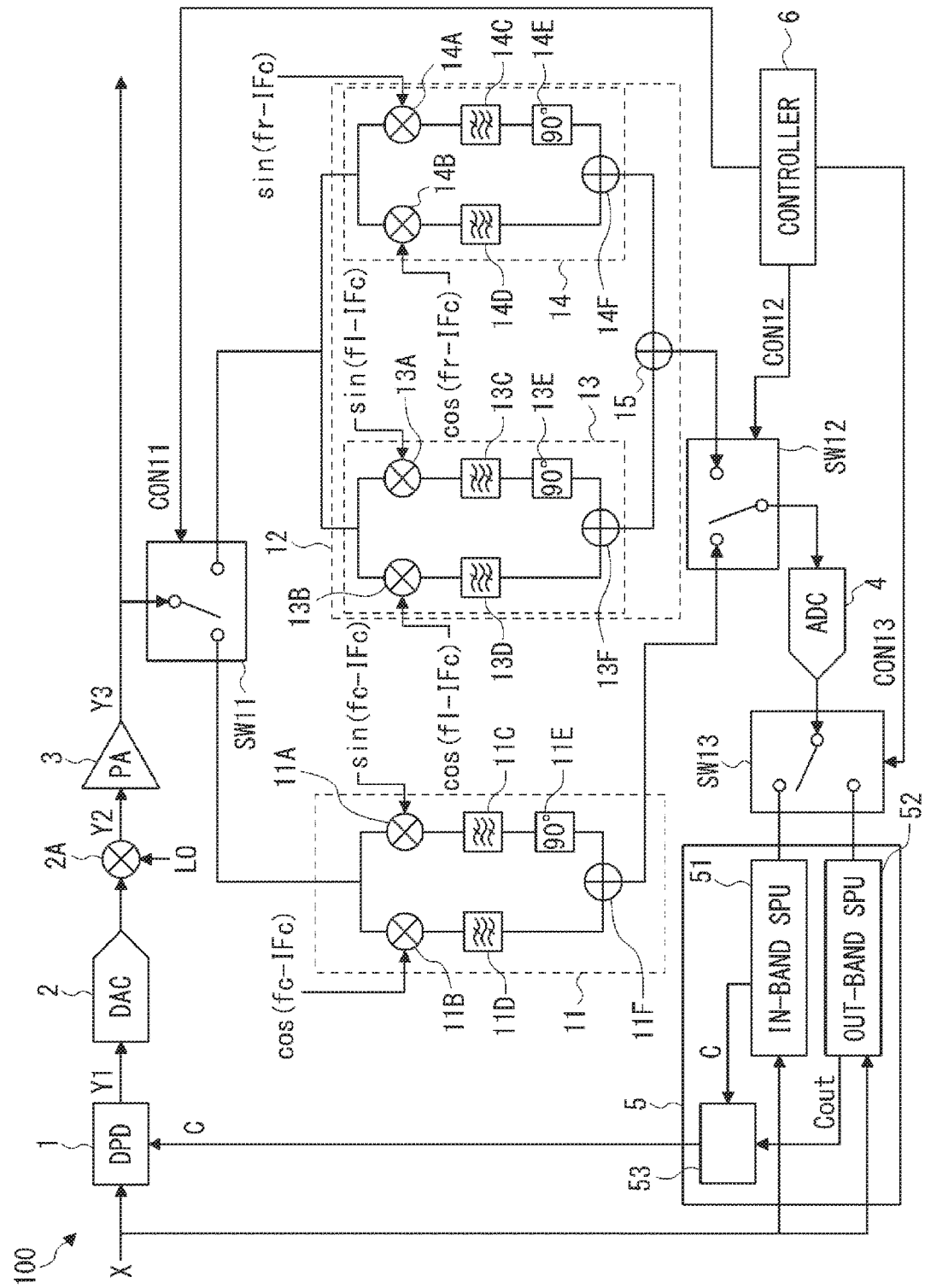
[FIG. 2]

[Fig. 3]
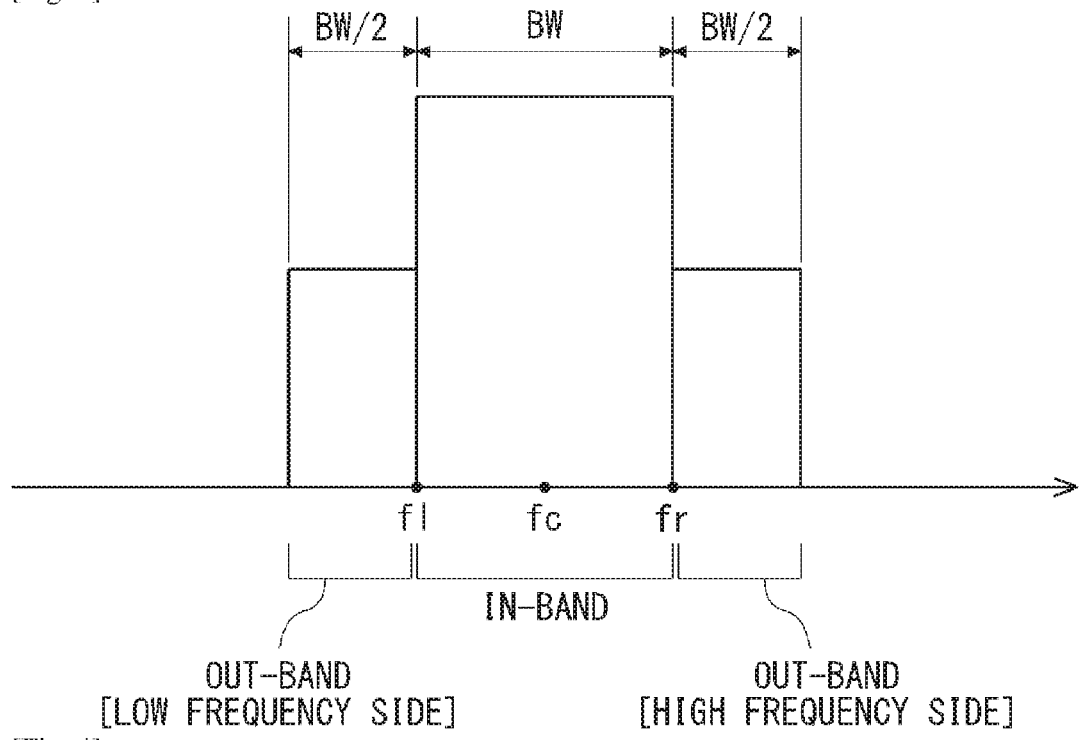
[Fig. 4]
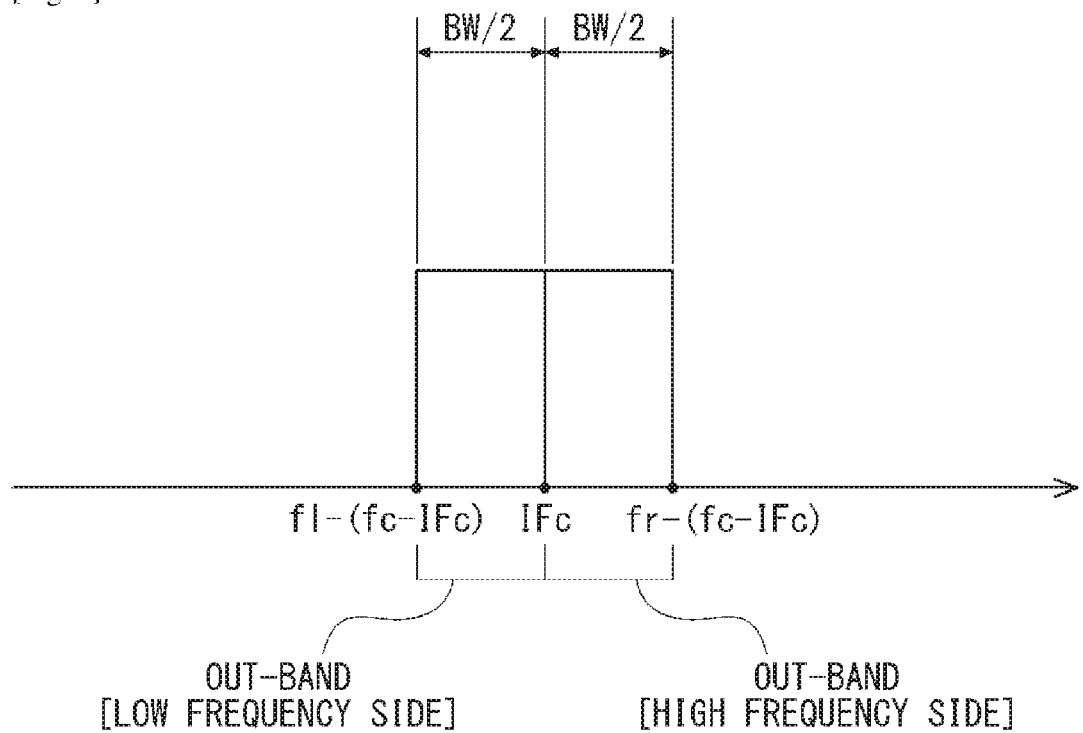

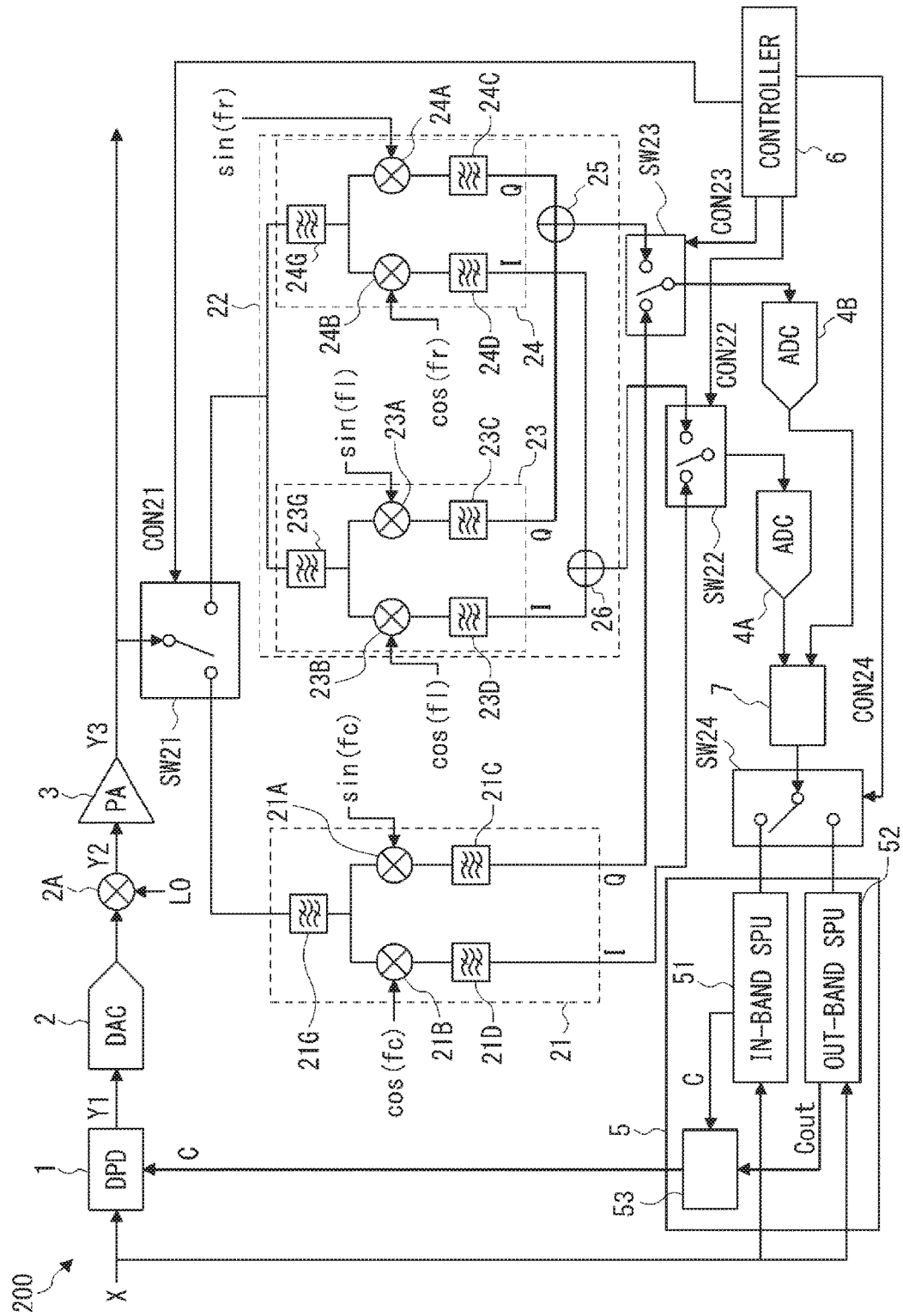
[FIG. 5]

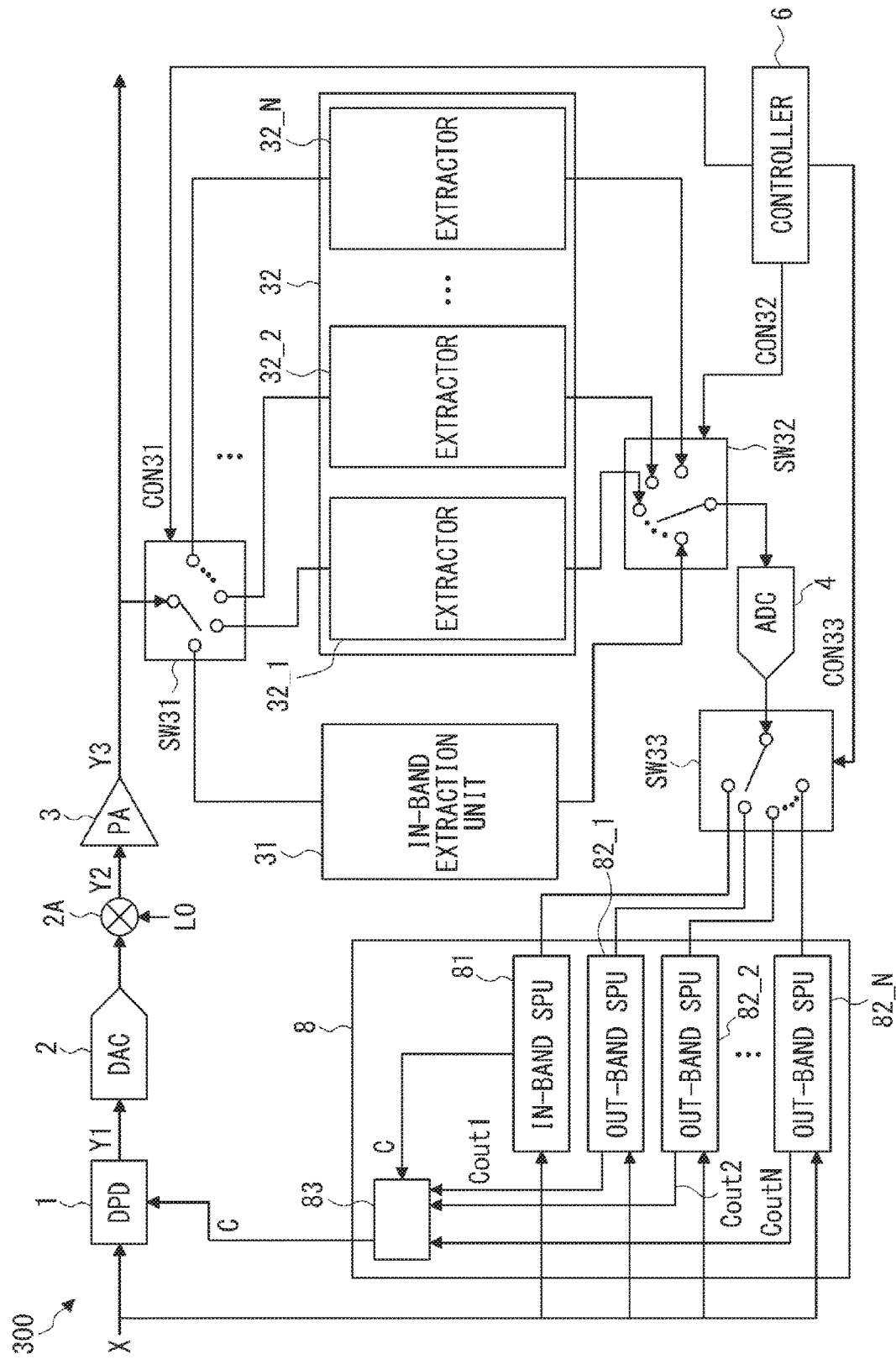
[FIG. 6]

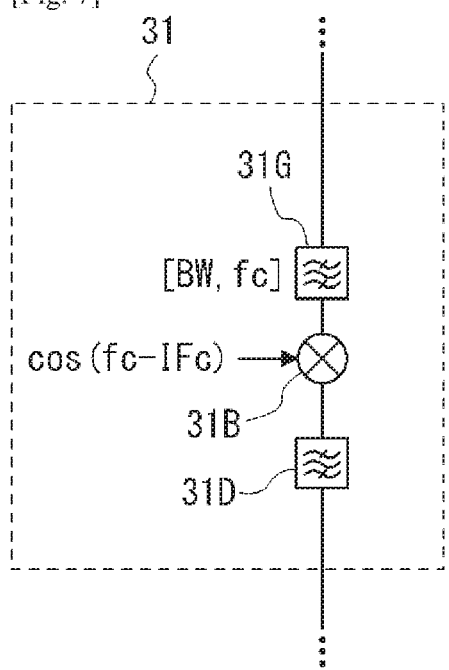
[Fig. 7]

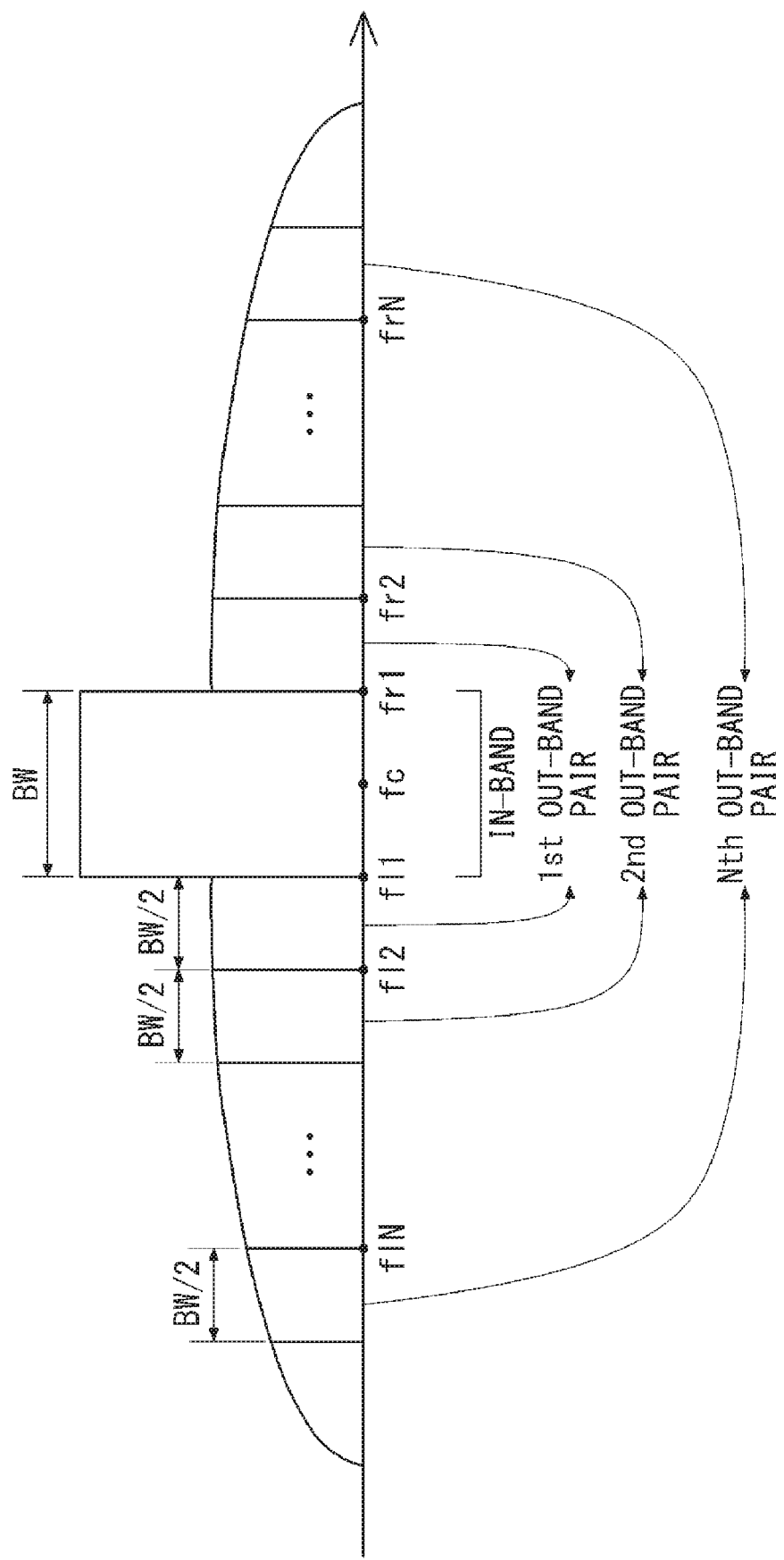

[Fig. 9]
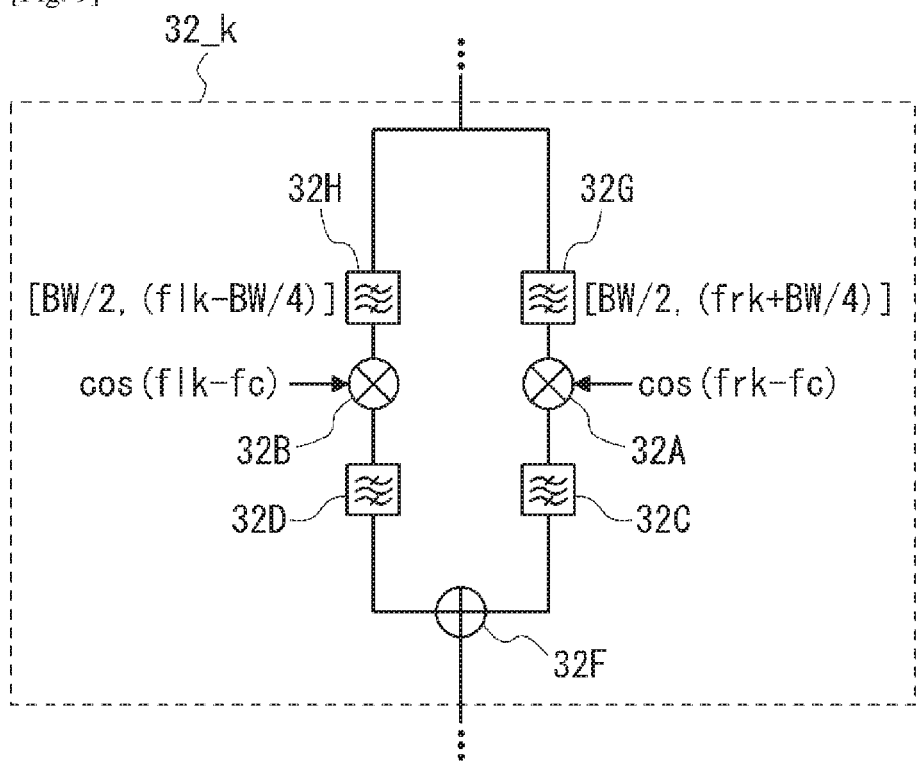

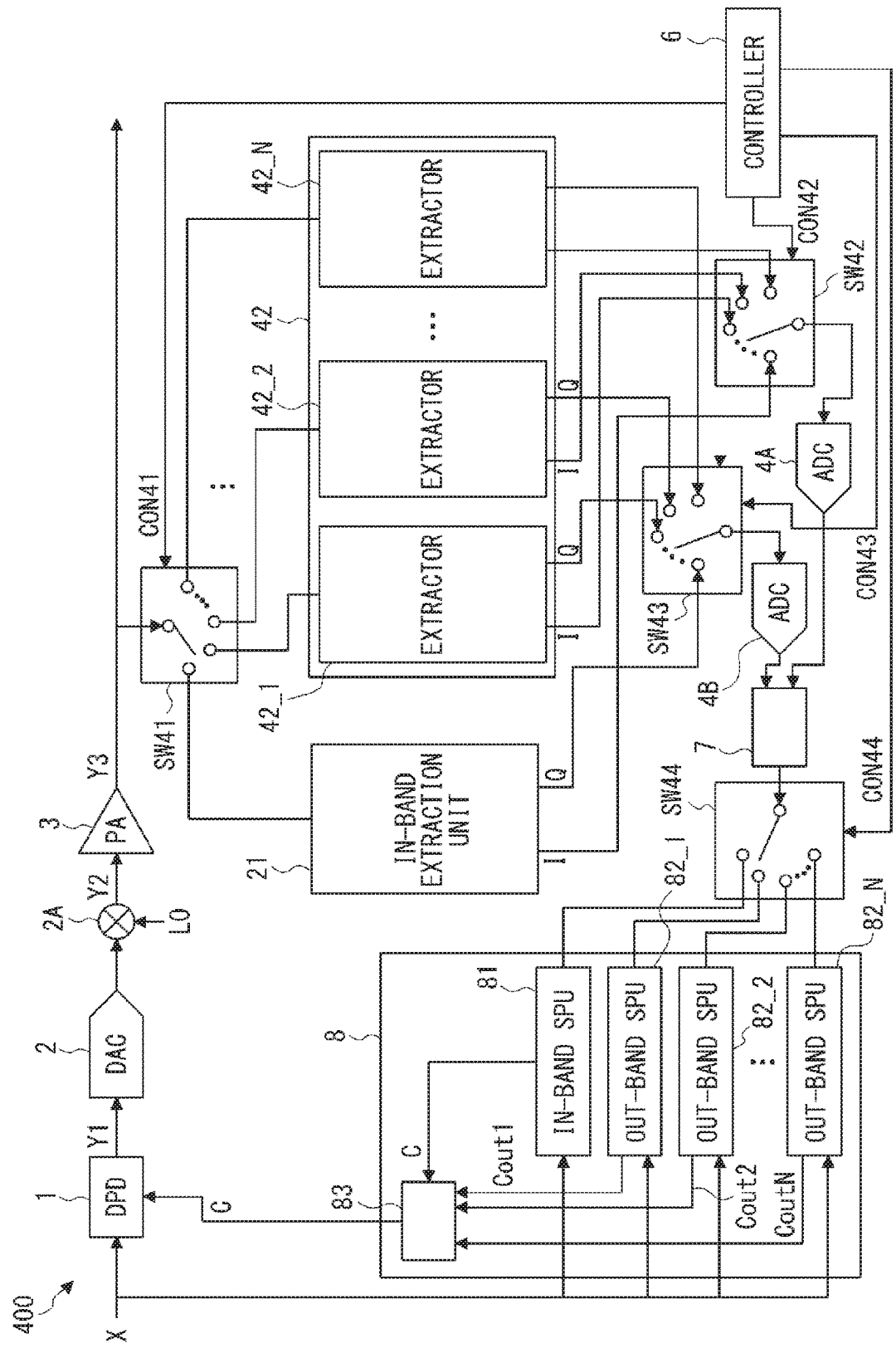
[FIG. 10]

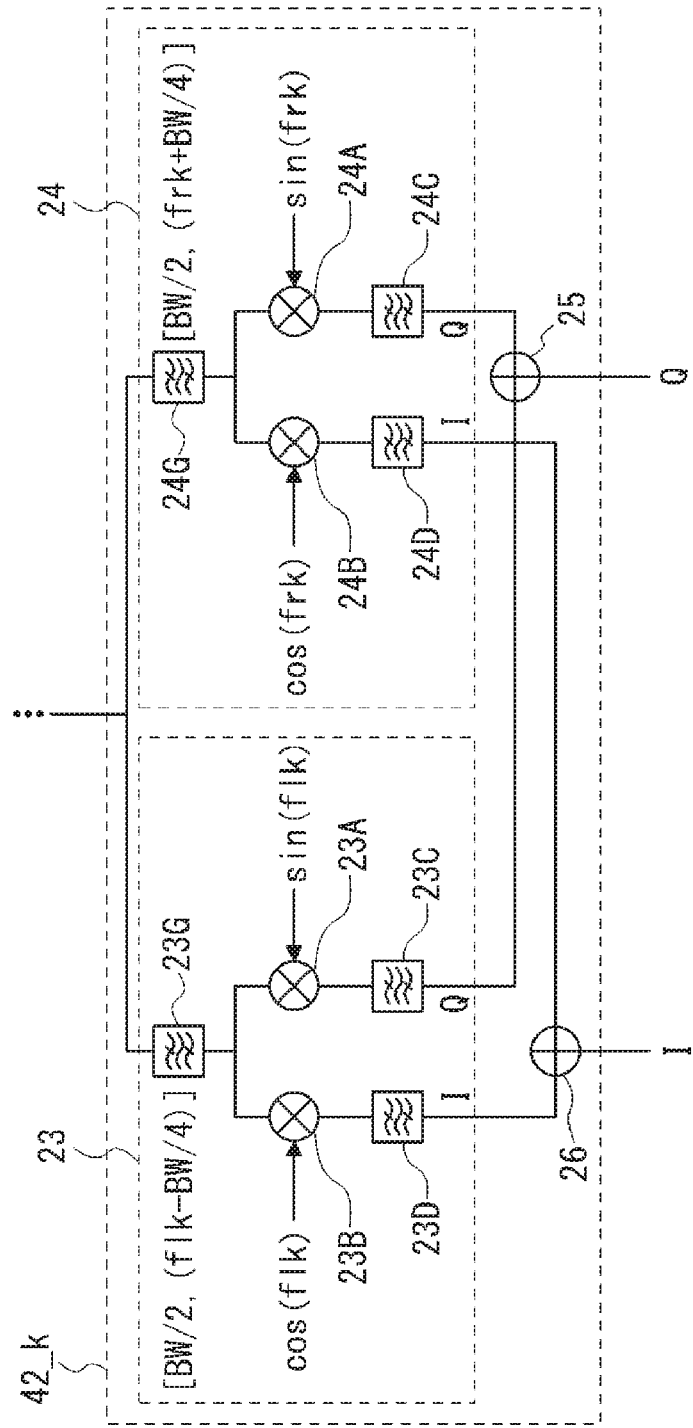
[FIG. 11]

[Fig. 12]
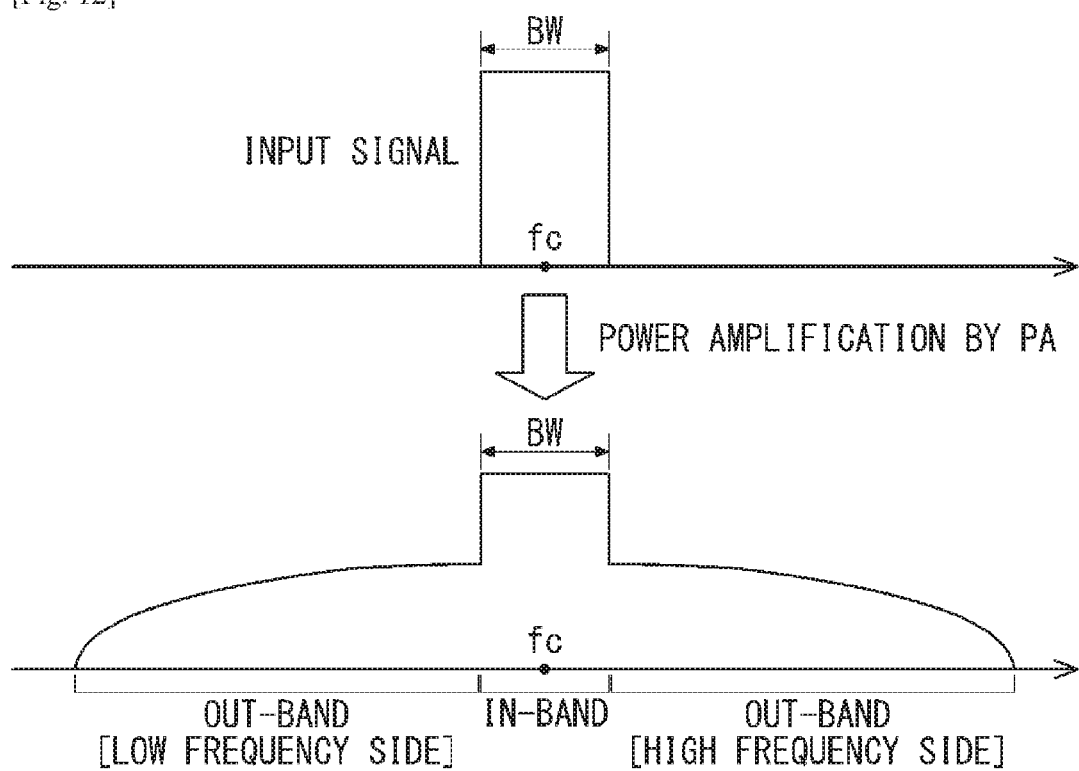

AMPLIFIER, CONFIGURATION METHOD OF AMPLIFIER, AND COMMUNICATION APPARATUS

CROSS-REFERENCE TO RELATED APPLICATIONS

This application is a national stage application of International Application No. PCT/JP2017/043479, entitled, "AMPLIFIER, CONFIGURATION METHOD OF AMPLIFIER, AND COMMUNICATION APPARATUS," filed on Dec. 4, 2017, the disclosure of which is hereby incorporated by reference in its entirety.

TECHNICAL FIELD

The present invention relates to an amplifier, a configuration method of an amplifier, and a communication apparatus.

BACKGROUND ART

A power amplifier (PA) is an indispensable component for any communication system. For optimal performance, the PA is required to possess high linearity in wide range of power level. However, it is quite difficult to achieve such high linearity in real-world applications. Nonlinearity in the PA causes out-of-band spurious emissions, and thereby spectral expansion occurs and adjacent channel leakage ratio (ACLR) performance deteriorates. FIG. 12 illustrates spectral expansion due to the nonlinearity in the PA. For solving the above-described problem, various linearization techniques ranging from analog solutions to digital solutions have been proposed. The digital predistortion (DPD) is one of the most effective solution to remove the nonlinearity of the PA. In the DPD, an original signal is predistorted before being fed into the PA to remove nonlinearity.

The envisioned 5G system handles signals with bandwidths in a range of hundreds of MHz. Compounded with PA nonlinearity, this necessitates the usage of analog to digital converters (ADCs) in the feedback loop of the DPD in order of Gbps, which are exorbitantly costly. In order to overcome this problem, bandlimited DPDs, which extract information on PA nonlinearity as a feedback from an in-band of PA output, have been proposed. This is configured by putting a bandpass filter (BPF) in the feedback loop to reduce the ADC's sampling rate. Configurations for downconverting from a high frequency (e.g. RF) to lower frequency (e.g. a baseband or intermediate frequency (IF) band) have been proposed (Patent Literature 1 and Non Patent Literature 1).

Further, a significant amount of information included in out-bands of PA output is thrown out and, hence, the performance is sub-optimal.

Patent Literature 1 discloses an embodiment in which the out-bands of PA output are also analyzed in addition to the in-bands of PA output. This makes it possible to scoop extra information available in the out-bands of PA output in order to improve the performance.

CITATION LIST

Patent Literature

PTL 1: US Patent Publication No. 2016/0065147

Non Patent Literature

NPTL 1: R. N. Braithwaite, "Closed-loop digital predistortion (DPD) using an observation path with limited bandwidth", IEEE Trans. Microw. Theory Techn., vol. 63, no. 2, pp. 726-736, February 2015

SUMMARY OF INVENTION

Technical Problem

In PTL1, the out-bands extracted from either side (i.e., either of a low frequency side and high frequency side) of the in-band of PA output are processed separately for evaluation of model for the DPD. In this method, at each instant, only a solution path selected for searching optimized model for the DPD is performed so that only distortion in the selected side is corrected. Thus, performance of the other non-selected side deteriorates. As a result, this can lead to sub-optimal performance in the form of imbalance of ACLRs.

The present invention has been made in view of the above-mentioned problem, and an object of the present invention is to effectively improve linearity of an output signal of an amplifier.

Solution to Problem

An aspect of the present invention is an amplifier including: an in-band extraction unit configured to extract an in-band from an predistorted and amplified analog signal; an out-band extraction unit configured to extract at least one pair of out-bands including a low frequency side out-band and a high frequency side out-band from the predistorted and amplified analog signal; an analog to digital converter configured to convert the extracted in-band and out-bands to digital signals; and a signal processing unit configured to process information included in the digital signals converted by the analog to digital converter and adjust an operation of predistorting an input baseband digital signal to generate the predistorted and amplified analog signal.

An aspect of the present invention is a configuration method of an amplifier including: disposing an in-band extraction unit configured to extract an in-band from an predistorted and amplified analog signal; disposing an out-band extraction unit configured to extract at least one pair of out-bands including a low frequency side out-band and a high frequency side out-band from the predistorted and amplified analog signal; disposing an analog to digital converter configured to convert the extracted in-band and out-bands to digital signals; and disposing a signal processing unit configured to process information included in the digital signals converted by the analog to digital converter and adjust an operation of predistorting an input baseband digital signal to generate the predistorted and amplified analog signal.

Advantageous Effects of Invention

According to the present invention, it is possible to effectively improve linearity of an output signal of an amplifier.

BRIEF DESCRIPTION OF DRAWINGS

FIG. 1 is a block diagram schematically illustrating a basic configuration of an amplifier according to a first exemplary embodiment;

FIG. 2 schematically illustrates a configuration of the amplifier according to the first exemplary embodiment;

FIG. 3 illustrates an in-band to be extracted by an in-band extraction unit and out-bands to be extracted by an out-band extraction unit;

FIG. 4 illustrates spectrums of the out-bands combined by a combiner in the out-band extraction unit;

FIG. 5 schematically illustrates a configuration of an amplifier according to a second exemplary embodiment;

FIG. 6 schematically illustrates a configuration of an amplifier according to a third exemplary embodiment;

FIG. 7 illustrates a configuration of an in-band extraction unit according to the third exemplary embodiment;

FIG. 8 illustrates a plurality of pairs of out-bands to be extracted by an out-band extraction unit according to the third exemplary embodiment;

FIG. 9 illustrates a configuration of an extractor in the out-band extraction unit according to the third exemplary embodiment;

FIG. 10 schematically illustrates a configuration of an amplifier according to a fourth exemplary embodiment;

FIG. 11 illustrates a configuration of an extractor in an out-band extraction unit according to the fourth exemplary embodiment; and FIG. 12 illustrates spectral expansion due to nonlinearity in a power amplifier.

DESCRIPTION OF EMBODIMENTS

Exemplary embodiments of the present invention will be described below with reference to the drawings. In the drawings, the same elements are denoted by the same reference numerals, and thus a repeated description is omitted as needed.

First Exemplary Embodiment

An amplifier according to a first exemplary embodiment will be described. FIG. 1 is a block diagram schematically illustrating a basic configuration of the amplifier 100 according to the first exemplary embodiment. The amplifier 100 is configured to be used in a communication apparatus. The basic configuration of the amplifier 100 includes an analog to digital converter (ADC) 4, a signal processing unit 5, an in-band extraction unit 11, and an out-band extraction unit 12.

The input signal X that is a baseband digital signal is predistorted in response to a coefficient C provided from the signal processing unit 5. The predistorted digital signal is unconverted, converted from a digital signal to an analog signal, and amplified to generate a predistorted and amplified output signal Y3 as described below. The output signal Y3 is output to the outside of the amplifier 100. Further, the output signal Y3 is supplied to the in-band extraction unit 11 or the out-band extraction unit 12 through a switch or the like as described below.

The in-band extraction unit 11 is configured to extract an in-band from the output signal Y3 and downconvert the extracted in-band to an intermediate frequency IFc. The out-band extraction unit 12 is configured to extract out-bands of both sides of the in-band from the output signal Y3 and downconvert the extracted out-bands to the intermediate frequency IFc (IFc<fc). Here, the in-band is a band to be used for communication, and the out-bands are bands out of the in-band caused by distortion or the like included in the output signal Y3. FIG. 3 illustrates the in-band to be extracted by the in-band extraction unit 11 and the out-bands to be extracted by the out-band extraction unit 12. In FIG. 3, fc is a central frequency of the in-band, fl denotes the lowest frequency of the in-band and the highest frequency of an out-band of a low frequency side of the in-band (also referred to as a low frequency side out-band), and fr denotes the highest frequency of the in-band and the lowest frequency of an out-band of a high frequency side of the in-band (also referred to as a high frequency side out-band).

The ADC 4 receives either of the in-band extracted by the in-band extraction unit 11 and the out-bands extracted by the out-band extraction unit 12. The ADC 4 converts either of the received in-band and out-bands from an analog signal to a digital signal. Then, the ADC 4 outputs the converted digital signal. An input of the ADC 4 may be connected with either of an output of the in-band extraction unit 11 and an output of the out-band extraction unit 12 through a switch or the like as described below.

The signal processing unit 5 receives either of the in-band and out-bands converted by the ADC 4. The signal processing unit 5 can adjust the coefficient C with referring to the received digital signal that includes information of the in-band, and provide the coefficient C used for predistorting the input signal X. The signal processing unit 5 can further adjust the coefficient C with referring to the received digital signal that includes information of the out-bands in order to suppress the out-bands of both of the low and high frequency sides.

Subsequently, a configuration of the amplifier 100 will be further described in more detail. FIG. 2 schematically illustrates the configuration of the amplifier 100 according to the first exemplary embodiment. As illustrated in FIG. 2, the amplifier 100 further includes a digital predistortion (DPD) unit 1, a digital to analog converter (DAC) 2, a power amplifier (PA) 3, a mixer 2A, a controller 6, and switches SW 11 to SW 13.

The DPD unit 1 receives the input signal X that is the baseband digital signal. The DPD unit 1 is configured to predistort the input signal X using a model for DPD determined by the coefficient C provided from the signal processing unit 5. The DPD unit 1 provides a predistorted input Y1 to the DAC 2.

The predistorted input Y1 is converted from a digital signal to an analog signal by the DAC 2. The DAC 2 can also upconvert the predistorted input Y1 from a baseband frequency to a higher frequency (the frequency fc). This upconversion can be performed by a mixer (not illustrated in the drawings) that is disposed in the DAC 2 or disposed separately from the DAC 2. The signal digital-analog converted and upconverted is provided to the PA 3 as a converted signal Y2.

In this case, the mixer 2A is disposed between the DAC 2 and the PA 3. The mixer 2A receives the converted input, which is digital-analog converted by the DAC 2 and has a frequency such as the baseband frequency and the intermediate frequency, from the DAC 2, and a local oscillation signal LO from a non-illustrated signal source.

The PA 3 amplifies the converted signal Y2 and outputs the output signal Y3. The output signal Y3 is output to the outside of the amplifier 100. Further, the amplified output signal Y3 is supplied to the in-band extraction unit 11 or the out-band extraction unit 12 through a switch or the like as described below.

The switch SW11 connects an output of the PA 3 with either of an input of the in-band extraction unit 11 and an input of the out-band extraction unit 12 in response to a control signal CON11 provided from the controller 6.

The switch SW12 connects the input of the ADC 4 with either of the output of the in-band extraction unit 11 and the output of the out-band extraction unit 12 in response to a control signal CON12 provided from the controller 6.

The switch SW13 connects an output of the ADC 4 with either of an input of an in-band spectrum processing unit (in-band SPU) 51 and an input of an out-band spectrum processing unit (out-band SPU) 52 included in the signal processing unit 5 in response to a control signal CON13 provided from the controller 6.

The controller 6 controls switching operations of the switches SW11 to SW13 according to analysis modes. When analyzing the in-band of an PA output (an in-band analysis mode), the controller 6 controls the switch SW11 to connect the output of the PA 3 with the input of the in-band extraction unit 11, controls the switch SW12 to connect the output of the in-band extraction unit 11 with the input of the ADC 4, and controls the switch SW13 to connect the output of ADC 4 with the input of the in-band spectrum processing unit 51 in the signal processing unit 5. In this case, the DPD unit 1, the DAC 2, the PA 3, the in-band extraction unit 11, the ADC 4 and the signal processing unit 5 constitute a feedback loop for analyzing the in-band of the PA output.

When analyzing the out-bands of the PA output (an out-band analysis mode), the controller 6 controls the switch SW11 to connect the output of the PA 3 with the input of the out-band extraction unit 12, controls the switch SW12 to connect the output of the out-band extraction unit 12 with the input of the ADC 4, and controls the switch SW13 to connect the output of ADC 4 with the input of the out-band spectrum processing unit 52 in the signal processing unit 5. In this case, the DPD unit 1, the DAC 2, the PA 3, the out-band extraction unit 12, the ADC 4 and the signal processing unit 5 constitute a feedback loop for analyzing both out-bands of the PA output.

The in-band extraction unit 11 is configured as a frequency conversion unit using a so-called Hartley Architecture. The in-band extraction unit 11 includes mixers 11A and 11B, band-pass filters (BPFs) 11C and 11D, a phase shifter 11E, and a combiner 11F. In the in-band extraction unit 11, the extracted in-band is downconverted to the intermediate frequency IFc.

In the in-band analysis mode, the mixer 11A receives the output signal Y3 through the switch SW11 as an input signal and receives a sine signal of a frequency (fc-IFc) as an oscillation signal. The mixer 11A mixes the received output signal Y3 and the oscillation signal and outputs the mixed signal. The mixed signal is passed through the BPF 11C in order to reject harmonic components in the mixed signal and further passed through the phase shifter 11E in order to shift a phase of the mixed signal by 90 degrees. The mixed signal passed through the BPF 11C and the phase shifter 11E is provided to the combiner 11F.

The mixer 11B receives the output signal Y3 through the switch SW11 as an input signal and receives a cosine signal of the frequency (fc-IFc) as an oscillation signal. In sum, a phase of the oscillation signal provided to the mixer 11A and a phase of the oscillation signal provided to the mixer 11B are perpendicular to each other. The mixer 11B mixes the received output signal Y3 and the oscillation signal and outputs the mixed signal. The mixed signal is passed through the BPF 11D in order to reject harmonic components in the mixed signal. The mixed signal passed through the BPF 11D is provided to the combiner 11F.

The combiner 11F combines the mixed signal passing through the BPF 11C and the phase shifter 11E and the mixed signal passing through the BPF 11D, and outputs the resulting in-band downconverted to the frequency IFc. Note that a bandwidth of the in-band signal is BW in the present exemplary embodiment.

The out-band extraction unit 12 extracts the out-bands of both sides of the in-band in the out-band analysis mode. In the out-band extraction unit 12, the extracted out-bands are downconverted to the intermediate frequency IFc. The out-band extraction unit 12 is also configured as a frequency conversion unit using the so-called Hartley Architecture. The out-band extraction unit 12 includes a low frequency side extractor 13, a high frequency side extractor 14 and a combiner 15. The low frequency side extractor 13 is configured to extract and downconvert the low frequency side out-band (left side). The high frequency side extractor 14 is configured to extract and downconvert the high frequency side out-band (right side).

The low frequency side extractor 13 will be described. The low frequency side extractor 13 includes mixers 13A and 13B, and BPFs 13C and 13D, a phase shifter 13E, and a combiner 13F. The mixers 13A and 13B, the BPFs 13C and 13D, the phase shifter 13E, and the combiner 13F constitute Hartley Architecture as in the in-band extraction unit 11.

In the low frequency side extractor 13, a sine signal of a frequency (fl-IFc) is provided to the mixer 13A as an oscillation signal and a cosine signal of the frequency (fl-IFc) is provided to the mixer 13B as an oscillation signal. In sum, a phase of the oscillation signal provided to the mixer 13A and a phase of the oscillation signal provided to the mixer 13B are perpendicular to each other. Thus, the combiner 13F outputs the low frequency side out-band, which is downconverted in such a manner that the highest frequency of the low frequency side out-band is the intermediate frequency IFc.

The high frequency side extractor 14 will be described. The high frequency side extractor 14 includes mixers 14A and 14B, and BPFs 14C and 14D, a phase shifter 14E, and a combiner 14F. The mixers 14A and 14B, the BPFs 14C and 14D, the phase shifter 14E, and the combiner 14F constitute Hartley Architecture as in the in-band extraction unit 11.

In the high frequency side extractor 14, a sine signal of a frequency (fr-IFc) is provided to the mixer 14A as an oscillation signal and a cosine signal of the frequency (fr-IFc) is provided to the mixer 14B as an oscillation signal. In sum, a phase of the oscillation signal provided to the mixer 14A and a phase of the oscillation signal provided to the mixer 14B are perpendicular to each other. Thus, the combiner 14F outputs the high frequency side out-band, which is downconverted in such a manner that the lowest frequency of the high frequency side out-band is the intermediate frequency IFc.

The combiner 15 combines the out-bands of the low and high frequency sides and outputs the combined out-bands to the switch SW12.

As described above, due to the frequencies of the oscillation signals, spectrums of the out-bands combined by the combiner 15 are adjacent to each other. FIG. 4 illustrates the spectrum of the out-bands combined by the combiner 15. As illustrated in FIG. 4, the out-bands of both of the low frequency side and the high frequency side are placed adjacent to each other without any overlap and each have a width of BW/2. Thus, a bandwidth of the extracted out-bands becomes the same as that of the extracted in-band. Therefore, the extracted in-band and out-bands can be converted by the same ADC 4.

The signal processing unit 5 includes the in-band processing unit 51, the out-band processing unit 52, and a combiner 53.

In the in-band analysis mode, the in-band processing unit 51 can receive the in-band from the ADC 4 and processes the received in-band so that the in-band processing unit 51 modifies the model for DPD to improve linearity of the PA 3. In this case, an analysis result for modifying the model for DPD provided by the in-band processing unit 51 is denoted by the coefficient C. The coefficient C is provided to the combiner 53. Note that the in-band analysis mode is executed prior to the out-band analysis mode. The combiner 53 passes on this coefficient C to the DPD 1 without any modification in the in-band analysis mode.

Subsequently, in the out-band analysis mode following the in-band analysis mode, the out-band processing unit 52 receives the out-bands from the ADC 4 and processes the received out-bands so that the out-band processing unit 52 modifies the model for DPD to further improve the linearity of the PA 3. In this case, an analysis result for modifying the model for DPD provided by the out-band processing unit 52 is denoted by a coefficient Cout. The coefficient Cout is provided to the combiner 53.

The combiner 53 can combine the coefficient Cout with the previously-provided coefficient C in order to update the coefficient C. In sum, the update of the coefficient C can be represented by the following expression.

$$C=C+Cout$$

Then, the combiner 53 provides the updated coefficient C to the DPD 1.

According to the present configuration, the model for DPD can be modified based on the out-bands of both sides that are simultaneously fed back from the PA output so that it is possible to advantageously suppress the out-bands of both sides and prevent imbalance of the out-bands from occurring.

Further, as described above, the bandwidth of the extracted out-bands can be the same as that of the extracted in-band. Therefore, both of the in-band and the out-bands can be handled by the same ADC used for the bandlimited DPD without disposing another ADC for handling the out-bands. Furthermore, the extracted in-bands and out bands are downconverted to the intermediate frequency or the baseband frequency. Therefore, it is not necessary to increase a speed of ADC and an ADC used for the general bandlimited PDP can be used without any changes.

Second Exemplary Embodiment

An amplifier 200 according to a second exemplary embodiment will be described. FIG. 5 schematically illustrates a configuration of the amplifier 200 according to the second exemplary embodiment. The amplifier 200 includes the DPD unit 1, the DAC 2, the PA 3, ADCs 4A and 4B, the signal processing unit 5, the controller 6, a combiner 7, an in-band extraction unit 21, an out-band extraction unit 22, switches SW21 to SW24. In the amplifier 200, the extracted in-band and out-bands are downconverted to the baseband frequency.

The switch SW21 connects the output of the PA 3 with an input of the in-band extraction unit 21 in the in-band analysis mode, or connects the output of the PA 3 with an input of the out-band extraction unit 22 in the out-band analysis mode, in response to a control signal CON21 provided from the controller 6.

The switch SW22 connects an input of the ADC 4A with an in-phase output of an in-band extraction unit 21 in the in-band analysis mode, or connects the input of the ADC 4A with an in-phase output of the out-band extraction unit 22 in the out-band analysis mode, in response to a control signal CON22 provided from the controller 6.

The switch SW23 connects an input of the ADC 4B with a quadrature-phase output of the in-band extraction unit 21 in the in-band analysis mode, or connects the input of the ADC 4B with a quadrature-phase output of the out-band extraction unit 22 in the out-band analysis mode, in response to a control signal CON23 provided from the controller 6.

The switch SW24 connects an output of the combiner 7 with the in-band spectrum processing unit 51 in the in-band analysis mode, or connects the output of the combiner 7 with the out-band spectrum processing unit 52 in the out-band analysis mode in response to a control signal CON24 provided from the controller 6.

The in-band extraction unit 21 extracts the in-band and downconverts the extracted in-band to the baseband frequency. The in-band extraction unit 21 is configured by using a structure of a homodyne receiver. The in-band extraction unit 21 includes mixers 21A and 21B, and BPFs 21C, 21D, and 21G. The BPF 21G is configured to pass a signal of a bandwidth BW centered on the frequency fc in order to extract the in-band of the bandwidth BW.

The mixer 21A receives a signal filtered by the BPF 21G and a sine signal of the frequency fc that is an oscillation signal. The mixer 21A mixes the signal received from the BPF 21G and the received oscillation signal to output the mixed signal. The mixed signal output from the mixer 21A is passed through the BPF 21C to reject harmonic components and the filtered signal that is a quadrature-phase component of the in-band is provided to the switch SW23.

The mixer 21B receives a signal filtered by the BPF 21G and a cosine signal of the frequency fc that is an oscillation signal. In sum, a phase of the oscillation signal provided to the mixer 21A and a phase of the oscillation signal provided to the mixer 21B are perpendicular to each other. The mixer 21B mixes the signal received from the BPF 21G and the received oscillation signal to output the mixed signal. The mixed signal output from the mixer 21B is passed through the BPF 21D to reject harmonic components and the filtered signal that is an in-phase component of the in-band is provided to the switch SW22.

The out-band extraction unit 22 is also configured as a frequency conversion unit using the structure of the homodyne receiver. The out-band extraction unit 22 includes a low frequency side extractor 23, a high frequency side extractor 24, and combiners 25 and 26. The low frequency side extractor 23 is configured to extract and downconvert the low frequency side out-band (left side). The high frequency side extractor 24 is configured to extract and downconvert the high frequency side out-band (right side).

The low frequency side extractor 23 will be described. The low frequency side extractor 23 includes mixers 23A and 23B, and BPFs 23C, 23D and 23G. The BPF 23G is configured to pass a signal of a bandwidth BW/2 centered on a frequency (fl-BW/4) in order to extract the low frequency side out-band of the bandwidth BW/2.

The mixers 23A and 23B, and the BPFs 23C and 23D constitute the homodyne receiver as in the case of the mixers 21A and 21B, and the BPFs 21C and 21D in the in-band extraction unit 21.

The mixer 23A receives the signal filtered by the BPF 23G and a sine signal of the frequency fl that is an oscillation signal. The mixer 23A mixes the signal received from the BPF 23G and the received oscillation signal to output the mixed signal. The mixed signal output from the mixer 23A is passed through the BPF 23C to reject harmonic components and the filtered signal that is a quadrature-phase component of the low frequency side out-band is provided to the combiner 25.

The mixer 23B receives the signal filtered by the BPF 23G and a cosine signal of the frequency fl that is an oscillation signal. In sum, a phase of the oscillation signal provided to the mixer 23A and a phase of the oscillation signal provided to the mixer 23B are perpendicular to each other. The mixer 23B mixes the signal received from the BPF 23G and the received oscillation signal to output the mixed signal. The mixed signal output from the mixer 23B is passed through the BPF 23D to reject harmonic components and the filtered signal that is an in-phase component of the low frequency side out-band is provided to the combiner 26.

Next, the high frequency side extractor 24 will be described. The high frequency side extractor 24 includes mixers 24A and 24B, and BPFs 24C, 24D and 24G. The BPF 24G is configured to pass a signal of the bandwidth BW/2 centered on the frequency (fr+BW/4) in order to extract the high frequency side out-band of the bandwidth BW/2.

The high frequency side extractor 24 has the same structure of the homodyne receiver as in the case of the low frequency side extractor 23 except for the oscillation signal provided to mixers. In sum, the mixers 24A and 24B, and the BPFs 24C and 24D correspond to the mixers 23A and 23B, and the BPFs 23C and 23D in the low frequency side extractor 23, respectively.

In this case, the mixer 24A receives a sine signal of the frequency fr as the oscillation signal, and the mixer 24B receives a cosine signal of the frequency fr as the oscillation signal. In sum, a phase of the oscillation signal provided to the mixer 24A and a phase of the oscillation signal provided to the mixer 24B are perpendicular to each other. Therefore, a signal filtered by the BPF 24C, which is a quadrature-phase component of the high frequency side out-band, is provided to the combiner 25. A signal filtered by the BPF 24D, which is an in-phase component of the high frequency side out-band, is provided to the combiner 26.

The combiner 25 combines the quadrature-phase component of the low frequency side out-band and the quadrature-phase component of the high frequency side out-band, and provides the combined quadrature-phase components of the out-bands of both sides to the switch SW23.

The combiner 26 combines the in-phase component of the low frequency side out-band and the in-phase component of the high frequency side out-band, and provides the combined in-phase components of the out-bands of both sides to the switch SW22.

The controller 6 controls switching operations of the switches SW21 to SW24 according to the analysis modes as described above. In the in-band analysis mode, the DPD unit 1, the DAC2, the PA 3, the in-band extraction unit 21, the ADCs 4A and 4B, the signal processing unit 5, and the combiner 7 constitute a feedback loop for analyzing the in-band of the PA output. In the out-band analysis mode, the DPD unit 1, the DAC2, the PA 3, the out-band extraction unit 22, the ADCs 4A and 4B, the signal processing unit 5, and the combiner 7 constitute a feedback loop for analyzing the out-bands of the PA output.

In the in-band analysis mode, the ADC 4A receives the in-phase component of the in-band through the switch SW22 and converts the received signal from the analog signal to the digital signal, and the ADC 4B receives the quadrature component of the in-band through the switch SW23 and converts the received signal from the analog signal to the digital signal. Then, the combiner 7 combines the in-phase and quadrature-phase components of the in-band and the combined in-band is provided to the in-band spectrum processing unit 51 thorough the switch SW24.

In the out-band analysis mode, the ADC 4A receives the in-phase components of the out-bands through the switch SW22 and converts the received signal from the analog signal to the digital signal, and the ADC 4B receives the quadrature components of the out-bands through the switch SW23 and converts the received signal from the analog signal to the digital signal. Then, the combiner 7 combines the in-phase and quadrature-phase components of the out-bands and the combined out-bands is provided to the out-band spectrum processing unit 52 through the switch SW24.

According to the present configuration, as in the first exemplary embodiment, the model for DPD can be modified based on the out-bands of both sides that are simultaneously fed back from the PA output so that it is possible to advantageously suppress the out-bands of both sides and prevent imbalance of the out-bands from occurring.

Third Exemplary Embodiment

An amplifier 300 according to a third exemplary embodiment will be described. FIG. 6 schematically illustrates a configuration of the amplifier 300 according to the third exemplary embodiment. The amplifier 300 has a configuration in which the signal processing unit 5, the in-band extraction unit 11, the out-band extraction unit 12, the switches SW11 to SW13 in the amplifier 100 according to the first exemplary embodiment are replaced with a signal processing unit 8, an in-band extraction unit 31, an out-band extraction unit 32, and switches SW31 to SW33, respectively. In the amplifier 300, the extracted in-band and out-bands are downconverted to the intermediate frequency IFc.

In the present exemplary embodiment, the in-band extraction unit 31 and the out-band extraction unit 32 are configured using a structure of a heterodyne receiver, while the in-band extraction unit 11 and the out-band extraction unit 12 are configured using Hartley Architecture in the first exemplary embodiment.

FIG. 7 illustrates a configuration of the in-band extraction unit 31. The in-band extraction unit 31 includes a mixer 31B, and BPFs 31D and 31G. The BPF 31G is configured to pass a signal of the bandwidth BW centered on the frequency fc in order to extract the in-band from the output signal Y3. The mixer 31B and the BPF 31D constitute the heterodyne receiver. The mixer 31B receives a signal filtered by the BPF 31G and a cosine signal of the frequency (fc-IFc) that is an oscillation signal. The mixer 31B mixes the signal received from the BPF 31G and the received oscillation signal to output the mixed signal. The mixed signal output from the mixer 31B is passed through the BPF 31D to reject harmonic components and the filtered in-band is provided to the switch SW32.

The out-band extraction unit 32 is configured to extract a plurality of pairs of the out-bands. FIG. 8 illustrates a plurality of pairs of the out-bands to be extracted by the out-band extraction unit 32 according to the third exemplary embodiment. In FIG. 8, N pairs of the out-band are illustrated where N is an integer equal to greater than one. Hereinafter, it is assumed that a parameter k is an integer from one to N, in sum, $1 \leq k \leq N$.

The k-th pair includes the k-th low frequency side out-band the highest frequency of which is flk and the k-th high frequency side out-band the lowest frequency of which is frk.

A configuration of the extractor 32_k for extracting k-th out-bands will be described. FIG. 9 illustrates a configuration of the extractor 32_k in the out-band extraction unit 32. The extractor 32_k includes a mixers 32A and 32B, a combiner 32F, and BPFs 32C, 32D, 32G and 32H. The BPF 32G is configured to pass a signal of a bandwidth BW/2 centered on a frequency (frk+BW/4) in order to extract the high frequency side out-band of the k-th out-band pair from the output signal Y3. The mixer 32A and the BPF 32C constitute the heterodyne receiver. The mixer 32A receives a signal filtered by the BPF 32G and a cosine signal of a frequency (frk-IFc) that is an oscillation signal. The mixer 32A mixes the signal received from the BPF 32G and the received oscillation signal to output the mixed signal. The mixed signal output from the mixer 32A is passed through the BPF 32C to reject harmonic components and the filtered high frequency side out-band of the k-th out-band pair is provided to the combiner 32F.

The BPF 32H is configured to pass a signal of a bandwidth BW/2 centered on a frequency (flk-BW/4) in order to extract the low frequency side out-band of the k-th out-band pair from the output signal Y3. The mixer 32B and the BPF 32D constitute the heterodyne receiver. The mixer 32B receives a signal filtered by the BPF 32H and a cosine signal of a frequency (flk-IFc) that is an oscillation signal. The mixer 32B mixes the signal received from the BPF 32H and the received oscillation signal to output the mixed signal. The mixed signal output from the mixer 32B is passed through the BPF 32D to reject harmonic components and the filtered low frequency side out-band of the k-th out-band pair provided to the combiner 32F.

The combiner 32F combines the low frequency side out-band and high frequency side out-band of the k-th out-band pair and the combined out-bands of both sides are provided to the switch SW32. Therefore, the k-th extractor 32_k can provide the out-bands of both sides of the k-th out-band pair to the switch SW32, respectively.

Subsequently, operations of the switches SW31 to SW33 and the controller 6 and the signal processing unit 8 will be described. The signal processing unit 8 has a configuration in which the in-band spectrum processing unit 51 is replaced with an in-band spectrum processing unit 81, the out-band spectrum processing unit 52 is replaced with first to N-th out-band spectrum processing units 82_1 to 82_N and the combiner 51 is replaced with a combiner 83 as compared to the signal processing unit 5.

The switch SW31 connects the output of the PA 3 with one of an input of the in-band extraction unit 31 and inputs of the extractors 32_1 to 32_N in the out-band extraction unit 32 in response to a control signal CON31 provided from the controller 6.

The switch SW32 connects the input of the ADC 4 with one of an output of the in-band extraction unit 31 and outputs of the extractors 32_1 to 32_N in the out-band extraction unit 32 in response to a control signal CON32 provided from the controller 6.

The switch SW33 connects the output of the ADC 4 with one of an input of the in-band spectrum processing unit 81 and inputs of first to N-th out-band spectrum processing unit 82_1 to 82_N included in the signal processing unit 8 in response to a control signal CON33 provided from the controller 6.

In the in-band analysis mode, the controller 6 controls the switches SW31 to SW33 in such a manner that the DPD unit 1, the DAC 2, the PA 3, the in-band extraction unit 31, the ADC 4, the signal processing unit 8 (i.e. the in-band spectrum processing unit 81) constitute a feedback loop for the in-band analysis.

In the out-band analysis mode for the k-th out-band pair, the controller 6 controls the switches SW31 to SW33 in such a manner that the DPD unit 1, the DAC 2, the PA 3, the extractor 32_k, the ADC 4, the signal processing unit 8 (i.e. the out-band spectrum processing unit 82_k providing the coefficient Coutk) constitute a feedback loop for the analysis of the k-th out-band pair.

Note that an order of executions of the analyses of the first to N-th out-band pairs is not limited. The analyses of the first to N-th out-band pairs may be sequentially executed from the first out-band pair to the N-th out-band pair. Specifically, the in-band analysis may be executed at a certain timing T, and the analyses of the first to N-th out-band pairs may be sequentially executed at timings T+kΔT, respectively. Further, the analyses of the first to N-th out-band pairs may be also executed in random order.

According to the present configuration, information extracted from a plurality of pairs of out-bands fed back from the PA output can be reflected on modification of the model for DPD. Therefore, it is possible to further improve the linearity of the PA 3.

Fourth Exemplary Embodiment

An amplifier 400 according to a fourth exemplary embodiment will be described. The amplifier 400 is a modified example of the amplifier 200 for analyzing a plurality of out-band pairs as in the amplifier 300. FIG. 10 schematically illustrates a configuration of the amplifier 400 according to the fourth exemplary embodiment. The amplifier 400 has a configuration in which the signal processing unit 5, the out-band extraction unit 22, and the switches SW21 to SW24 in the amplifier 200 according to the second exemplary embodiment are replaced with the signal processing unit 8, the out-band extraction unit 42, and the switches SW41 to SW44, respectively. In the amplifier 400, the extracted in-band and out-bands are downconverted to the baseband frequency.

The out-band extraction unit 42 includes N extractors 42_1 to 42_N. FIG. 11 illustrates a configuration of a k-th extractor 42_k in the out-band extraction unit 42. Each of the extractors 42_1 to 42_N has the same configuration as the out-band extraction unit 22 in the amplifier 200 except for the oscillation signals and the center of the bandwidth of the BPF 23G and 24G. In the k-th extractor 42_k, the BPF 23G is configured to pass a signal of the bandwidth BW/2 centered on the frequency (flk-BW/4) in order to extract the low frequency side out-band of the k-th out-band pair from the output signal Y3, and the BPF 24G is configured to pass a signal of the bandwidth BW/2 centered on the frequency (frk+BW/4) in order to extract the high frequency side out-band of the k-th out-band pair from the output signal Y3. Further, in the k-th extractor 42_k, the mixer 23A receives a sine signal of the frequency flk, the mixer 23B receives a cosine signal of the frequency flk, the mixer 24A receives a sine signal of a frequency frk, and the mixer 24B receives a cosine signal of the frequency frk.

Thus, the combiner 25 of the k-th extractors can output the quadrature-phase components of the out-bands of both sides of the k-th out-band pair, respectively. The combiner 26 of the k-th extractors can output the in-phase components of the out-bands of both sides of the k-th out-band pair, respectively.

Subsequently, operations of the switches SW41 to SW44 and the controller 6 and the signal processing unit 8 will be described.

The switch SW41 connects the output of the PA 3 with one of the input of the in-band extraction unit 21 and inputs of the extractors 42_1 to 42_N in the out-band extraction unit 42 in response to a control signal CON41 provided from the controller 6.

The switch SW42 connects the input of the ADC 4A with one of the in-phase output of the in-band extraction unit 21 and in-phase outputs of the extractors 42_1 to 42_N (i.e. outputs of the combiners 26) in the out-band extraction unit 42 in response to a control signal CON42 provided from the controller 6.

The switch SW43 connects the input of the ADC 4B with one of the quadrature-phase output of the in-band extraction unit 21 and quadrature-phase outputs of the extractors 42_1 to 42_N (i.e. outputs of the combiners 25) in the out-band extraction unit 42 in response to a control signal CON43 provided from the controller 6.

The switch SW44 connects the output of the combiner 7 with one of the input of the in-band spectrum processing unit 81 and the inputs of first to N-th out-band spectrum processing units 82_1 to 82_N included in the signal processing unit 8 in response to a control signal CON44 provided from the controller 6.

In the in-band analysis mode, the controller 6 controls the switches SW41 to SW44 in such a manner that the DPD unit 1, the DAC 2, the PA 3, the in-band extraction unit 21, the ADCs 4A and 4B, the signal processing unit 8 (i.e. the in-band spectrum processing unit 81) constitute a feedback loop for the in-band analysis.

In the out-band analysis mode for the k-th out-band pair, the controller 6 controls the switches SW41 to SW44 in such a manner that the DPD unit 1, the DAC 2, the PA 3, the k-th extractor 42_k, the ADCs 4A and 4B, the signal processing unit 8 (i.e. the out-band spectrum processing unit 82_k) constitute a feedback loop for the analysis of the k-th out-band pair.

Note that an order of executions of the analyses of the first to N-th out-band pairs is not limited as in the third exemplary embodiment. The analyses of the first to N-th out-band pairs may be sequentially executed from the first out-band pair to the N-th out-band pair. Specifically, the in and analysis may be executed at a certain timing T, and the analyses of the first to N-th out-band pairs may be sequentially executed at timings T+kΔT, respectively. Further, the analyses of the first to N-th out-band pairs may be also executed in random order.

According to the present configuration, information extracted from a plurality of pairs of out-bands fed back from the PA output can be reflected on modification of the model for DPD. Therefore, it is possible to further improve the linearity of the PA 3.

Other Embodiment

Note that the present invention is not limited to the above exemplary embodiments and can be modified as appropriate without departing from the scope of the invention. For example, Hartley Architecture, Homodyne Architecture, and Heterodyne Architecture are applied to configure the in-band extraction unit and the out-band extraction unit, however those architecture are merely examples. As long as the functions of the in-band extraction unit and the out-band extraction unit can be achieved, it should be appreciated that another architecture or another configuration may be applied.

In the exemplary embodiments described above, the switches are used for configuring the feedback loop for analyzing the in-band and out-bands of the PA output. Therefore, the configuration of the feedback loop is not limited to those configurations. As long as the configuration of the feedback loop that can achieve the function of the configuration of the feedback loop according to the exemplary embodiments described above, other structures or units that can perform switching operation or signal distribution may be adopted.

While the present invention has been described above with reference to exemplary embodiments, the present invention is not limited to the above exemplary embodiments. The configuration and details of the present invention can be modified in various ways which can be understood by those skilled in the art within the scope of the invention.

REFERENCE SIGNS LIST

1 DIGITAL PREDISTORTION UNIT
2 DIGITAL TO ANALOG CONVERTER
3 POWER AMPLIFIER
4, 4A, 4B ANALOG TO DIGITAL CONVERTERS
5, 8 SIGNAL PROCESSING UNITS
6 CONTROLLER
7 COMBINER
11, 21, 31 IN-BAND EXTRACTION UNIT
12, 22, 32_k, 42_k OUT-BAND EXTRACTION UNITS
100, 200, 300, 400 AMPLIFIERS
11A, 11B, 13A, 13B, 14A, 14B, 21A, 22B, 23A, 23B, 24A, 24B, 31B, 32A, 32B, MIXERS
11C, 11D, 13C, 13D, 14C, 14D, 21C, 21D, 21G, 23C, 23D, 23G, 24C, 24D, 24G, 31D, 31G, 32C, 32D, 32G, 32H, BAND PASS FILTERS
11E PHASE SHIFTER
11F, 13F, 14F COMBINERS
25, 26 COMBINERS
51, 81 IN-BAND SPECTRUM PROCESSING UNITS
52, 82_k OUT-BAND SPECTRUM PROCESSING UNITS
53, 83 COMBINERS
CON11 TO CON 13, CON21 TO CON 24, CON31 TO CON 33, CON41 TO CON
44 CONTROL SIGNALS
SW11 TO SW13, SW21 TO SW24, SW31 TO SW33, SW41 TO SW44 SWITCHES

The invention claimed is:

1. An amplifier comprising:
an in-band extraction unit configured to extract an in-band from an predistorted and amplified analog signal;
an out-band extraction unit configured to extract at least one pair of out-bands including a low frequency side out-band and a high frequency side out-band from the predistorted and amplified analog signal;
an analog to digital converter configured to convert the extracted in-band and out-bands to digital signals; and
a signal processing unit configured to process information included in the digital signals converted by the analog to digital converter and adjust an operation of predistorting an input baseband digital signal to generate the predistorted and amplified analog signal, wherein
a bandwidth of each of an extracted low frequency side out-band and an extracted high frequency side out-band included in each pair of the extracted out-bands is one-half of a bandwidth of the extracted in-band the in-band extraction unit downconverts the extracted in-band to cause a center frequency of the extracted in-band to be a predetermined frequency, the out-band extraction unit downconverts each of the pair of the extracted out-band to cause the highest frequency of the extracted low frequency side out-band to be the predetermined frequency and the lowest frequency of the extracted high frequency side out-band to be the predetermined frequency, the predetermined frequency is one of a baseband frequency that is a frequency of the input baseband digital signal and an intermediate frequency the in-band extraction unit comprises at least one Hartley Architecture, at least one homodyne receiver, or at least one heterodyne receiver that extracts and downconverts the extracted in-band, and the out-band extraction unit comprises at least one Hartley Architecture, at least one homodyne receiver, or at least one heterodyne receiver that extracts and downconverts each of the pair of the extracted out-bands.

2. The amplifier according to claim 1, wherein the input baseband digital signal is predistorted by using a model for predistortion whose performance is controlled by control information provided from the signal processing unit, the signal processing unit generates the control information by processing information of the extracted in-band and updates the generated control information by processing information of at least one pair of the extracted out-bands.

3. An amplifier comprising:

an in-band extraction unit configured to extract an in-band from an predistorted and amplified analog signal;

an out-band extraction unit configured to extract at least one pair of out-bands including a low frequency side out-band and a high frequency side out-band from the predistorted and amplified analog signal;

an analog to digital converter configured to convert the extracted in-band and out-bands to digital signals; and a signal processing unit configured to process information included in the digital signals converted by the analog to digital converter and adjust an operation of predistorting an input baseband digital signal to generate the predistorted and amplified analog signal, wherein the out-band extraction unit extracts a plurality of pairs of out-bands in order from the in-band, and the signal processing unit processes the information of the plurality of pairs of out-bands in order from the in-band or in random order.

4. A communication apparatus comprising the amplifier according to claim 1.

5. A configuration method of an amplifier comprising:

disposing an in-band extraction unit configured to extract an in-band from an predistorted and amplified analog signal;

disposing an out-band extraction unit configured to extract at least one pair of out-bands including a low frequency side out-band and a high frequency side out-band from the predistorted and amplified analog signal;

disposing an analog to digital converter configured to convert the extracted in-band and out-bands to digital signals; and disposing a signal processing unit configured to process information included in the digital signals converted by the analog to digital converter and adjust an operation of predistorting an input baseband digital signal to generate the predistorted and amplified analog signal, wherein a bandwidth of each of an extracted low frequency side out-band and an extracted high frequency side out-band included in each pair of the extracted out-bands is one-half of a bandwidth of the extracted in-band the in-band extraction unit downconverts the extracted in-band to cause a center frequency of the extracted in-band to be a predetermined frequency, the out-band extraction unit downconverts each of the pair of the extracted out-band to cause the highest frequency of the extracted low frequency side out-band to be the predetermined frequency and the lowest frequency of the extracted high frequency side out-band to be the predetermined frequency, the predetermined frequency is one of a baseband frequency that is a frequency of the input baseband digital signal and an intermediate frequency the in-band extraction unit comprises at least one Hartley Architecture, at least one homodyne receiver, or at least one heterodyne receiver that extracts and downconverts the extracted in-band, and the out-band extraction unit comprises at least one Hartley Architecture, at least one homodyne receiver, or at least one heterodyne receiver that extracts and downconverts each of the pair of the extracted out-bands.

6. A configuration method of an amplifier comprising:

disposing an in-band extraction unit configured to extract an in-band from an predistorted and amplified analog signal;

disposing an out-band extraction unit configured to extract at least one pair of out-bands including a low frequency side out-band and a high frequency side out-band from the predistorted and amplified analog signal;

disposing an analog to digital converter configured to convert the extracted in-band and out-bands to digital signals; and disposing a signal processing unit configured to process information included in the digital signals converted by the analog to digital converter and adjust an operation of predistorting an input baseband digital signal to generate the predistorted and amplified analog signal, wherein the out-band extraction unit extracts a plurality of pairs of out-bands in order from the in-band, and the signal processing unit processes the information of the plurality of pairs of out-bands in order from the in-band or in random order.

* * * * *